US008271910B2

(12) United States Patent
Tirapu-Azpiroz et al.

(10) Patent No.: US 8,271,910 B2
(45) Date of Patent: Sep. 18, 2012

(54) EMF CORRECTION MODEL CALIBRATION USING ASYMMETRY FACTOR DATA OBTAINED FROM AERIAL IMAGES OR A PATTERNED LAYER

(75) Inventors: Jaione Tirapu-Azpiroz, Poughkeepsie, NY (US); Timothy A. Brunner, Ridgefield, CT (US); Michael S. Hibbs, Westford, VT (US); Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 12/748,513

(22) Filed: Mar. 29, 2010

(65) Prior Publication Data

US 2011/0239169 A1  Sep. 29, 2011

(51) Int. Cl.
*G06F 17/50* (2006.01)
(52) U.S. Cl. .......................................... 716/54; 716/55
(58) Field of Classification Search .................... 716/54, 716/55
See application file for complete search history.

(56) References Cited

U.S. PATENT DOCUMENTS

| 7,294,437 | B2 | 11/2007 | Liu et al. | |
|---|---|---|---|---|
| 2005/0053845 | A1 | 3/2005 | Becker et al. | |
| 2006/0068334 | A1 | 3/2006 | Sandstrom et al. | |
| 2008/0020296 | A1 | 1/2008 | Hsu et al. | |
| 2008/0175432 | A1 | 7/2008 | Choi et al. | |
| 2010/0281449 | A1* | 11/2010 | RosenBluth et al. | ............ 716/19 |

FOREIGN PATENT DOCUMENTS

WO  WO 2008/049844 A1  5/2008

OTHER PUBLICATIONS

Andreas Erdmann, "Mask Modeling in the Low k1 and Ultrahigh NA Regime: Phase and Polarization Effects", Proc. SPIE 5835, 69 (2005).
Jaione Tirapu-Azpiroz et al., "Boundary Layer Model to Account for Thick Mask Effects in Photo Lithography" Proc. SPIE vol. 5040, 1611-1619 (2003).
M. Lam et al., "Domain Decomposition Methods for Simulation of Printing and Inspection of Phase Defects" Proc. SPIE vol. 5040, 1492-1501 (2003).
Michael S. Hibbs et al., "Phase Calibration for Attenuating Phase-Shifting Masks" Proc. SPIE vol. 6152, 61521L (2006).

(Continued)

*Primary Examiner* — Suresh Memula
(74) *Attorney, Agent, or Firm* — Ian D. MacKinnon; Daryl K. Neff

(57) ABSTRACT

A computer-implemented method is provided for generating an electromagnetic field (EMF) correction boundary layer (BL) model corresponding to a mask, which can include using a computer to perform a method, in which asymmetry factor data is determined from aerial image measurements of a plurality of different gratings representative of features provided on a mask, wherein the aerial image measurements having been made at a plurality of different focus settings. The method may also include determining boundary layer (BL) model parameters of an EMF correction BL model corresponding to the mask by fitting to the asymmetry factor measurements. Alternatively, the asymmetry factor data can be determined from measurements of line widths of photoresist patterns, wherein the photoresist patterns correspond to images cast by a plurality of gratings at a plurality of different defocus distances, and the gratings can be representative of features of a mask.

13 Claims, 11 Drawing Sheets

OTHER PUBLICATIONS

Martin Drapeau et. al., "A Practical Alternating PSM Modeling and OPC Approach to Deal With 3D Mask Effects for the 65nm Node and Beyond", Proc. SPIE vol. 5992, 59921T (2005).

K. Adam et al., "Methodology for Accurate and Rapid Simulation of Large Arbitrary 2D Layouts of Advanced Photomasks" Proc. SPIE vol. 4562 (2002).

Sangwook Kim et. al., "OPC to Account for Thick Mask Effects Using Simplified Boundary Layer Model", Proc. SPIE vol. 6349, 63493I (2006).

Axel M. Zibold et al. "Advances With the New AIMS™ Fab 193 2nd Generation: A System for the 65 nm Node Including Immersion", Proc. SPIE vol. 5853-131 (2005).

* cited by examiner

EMF CORRECTION MODEL CALIBRATION USING ASYMMETRY FACTOR DATA OBTAINED FROM AERIAL IMAGES OR A PATTERNED LAYER

BACKGROUND OF THE INVENTION

1. Field of the Invention

The present invention relates to photolithography, and more specifically to techniques for calibrating models that represent the response of the reticles, particularly to account for the impact of the reticle topography on the electromagnetic field ("EMF") transmitted through it, known as electromagnetic field ("EMF") effects thereof.

2. Description of the Related Art

The fabrication of semiconductor chips requires the precise creation of patterns on a semiconductor wafer. Photolithography is a technique used to create patterns on a semiconductor wafer by exposing a layer of photoresist material on the wafer with an image cast by a beam of light transmitted through a reticle, also referred to as a photomask or "mask". The resist material is a photosensitive polymer that reacts to the light and will develop away in areas with enough light intensity exposure (assuming a positive tone resist). The reticle or mask typically includes a plate of transparent material such as quartz or glass, and a series of opaque metallic features, e.g., chrome features thereon, which correspond to the patterns to be created by the exposure of the photoresist layer.

The resolution of an optical photolithography system is limited by the wavelength of the illumination source, the optical properties of photolithography exposure equipment, or both. In practice, due to the lack of transparent optical components at shorter wavelengths, and the lack of adequate optical sources, sources of wavelength no shorter than 193 nanometer are currently used in advanced photolithography, even as the required minimum feature size on the wafer continues to shrink. This means that lithographic processes are required to print at ever deeper sub-wavelength scales. To help achieve the smallest size patterns in the photoresist (hereinafter "resist") layer, advances in the resist process and techniques for enhancing resolution such as the deliberate distortion of the mask design to pre-compensate for optical proximity effects (so-called optical proximity corrections or OPC), and masks that include phase shifting features have all been applied in various forms and combinations. The application of OPC algorithms to a full chip consists of the iterative simulation of the predicted printed resist contours and the movement of mask edges until these contours print the desired design on the wafer. In order to accurately predict the contours that will be printed on the resist layer, accurate models of the lithography process are required, including models for the transmission of light through the mask. These models are applied to a full chip design with billions of features. Therefore, the simulation performed for a design must have a manageable runtime, in addition to being accurate.

Another technique of resolution enhancement are phase shifting masks. For example, an alternating phase shift mask can include a transparent substrate, opaque features overlying the transparent substrate, and alternating phase shift features which can be provided in an additional transparent layer of the mask. One example of phase shifting masks is a so-called attenuated phase shifting mask (atten. PSM) which include a transparent substrate, and phase-shifting features overlying the substrate comprised of a material and having a height that limits light transmission through them, such as to a range between 6 and 20% of the light incident thereon. The phase-shifting features are designed to introduce exactly 180 degrees of phase shift relative to the light that propagates through clear openings of the mask which do not have phase-shifting features. These techniques of resolution enhancement have contributed to reduce the minimum feature size printed on a wafer in today's manufacturing processes, while maintaining the same illumination wavelength. In addition, while the features on masks typically have dimensions several, e.g., four times, larger than the features printed on the wafer, even these mask features are now approaching sub-wavelength dimensions, that is, dimensions smaller than the wavelength of the light.

One requirement for creating and using a mask in advanced sub-wavelength photolithography is to account for the degree to which the size and spacing of the features of the mask can influence the transmission of light through the mask relative to scalar approximations used in practice to model this transmission and that assume perfectly thin mask films. These influences include electromagnetic field ("EMF") effects which arise as a result of the thicknesses of the substrate, the opaque features thereon, and the phase shift features thereof.

Particularly when photolithography is used to define features smaller than the wavelength of the illumination source, the EMF effects of the mask can shift the locations of the edges of printed features. When patterning such features, the EMF effects need to be accounted for during OPC computations in order to guarantee printing the feature edges in the proper locations. One way that the EMF effects of a mask have been modeled is through numerical computation of Maxwell equations of electromagnetic propagation through the reticle. Computation of Maxwell equations is the most rigorous simulation of the fields transmitted through the mask, which accounts for the mask's optical properties, thicknesses of each opaque feature, the transparent substrate and the phase shift features to arrive at an accurate characterization of the light transmission through the mask that considers EMF effects. However, computing Maxwell equations to calculate the EMF effects through simulation is very computationally intensive.

Still further improvements can be made in methods by which the EMF effects of a mask can be accounted for through the use of simplified models of mask transmission.

SUMMARY OF THE INVENTION

In accordance with an embodiment of the invention, a computer-implemented method is provided of generating an electromagnetic field (EMF) correction boundary layer (BL) model corresponding to a mask. In such method, a computer can be used to perform a method, and the method can include determining asymmetry factor data from aerial image measurements of a plurality of different gratings representative of features provided on a mask, wherein the aerial image measurements have been made at a plurality of different focus settings. Boundary layer (BL) model parameters of an EMF correction BL model corresponding to the mask can be determined by fitting to the asymmetry factor measurements.

In accordance with one or more particular embodiments of the invention, the determining of the asymmetry factor data includes determining first asymmetry factor data corresponding to first mask features represented by a first grating, and determining second asymmetry factor data corresponding to second mask features represented by a second grating, and the determining of the BL model parameters includes determining feature-dependent BL model parameters including first BL model parameters and second BL model parameters, the first BL model parameters differing from the second BL model parameters according to a difference between the first and second gratings.

In accordance with one or more particular embodiments of the invention, the first and second mask features include line features and the line features of the first and second mask features have differing widths, respectively. The first BL model parameters can differ from the second BL model parameters according to the difference between the widths of the first and second mask features.

In accordance with one or more particular embodiments of the invention, a method of generating a mask corrected for EMF effects can further include applying an EMF correction BL model according to an embodiment described herein to a lithographic model of the mask, such that the corrected design of the mask is pre-compensated to account for the EMF effects of the mask.

In accordance with one or more particular embodiments of the invention, the asymmetry factor data can be determined from aerial image measurements made using unpolarized light, and the determining of the BL model parameters includes determining BL model parameters which are isotropic by fitting to the asymmetry factor data obtained from the aerial image measurements made using unpolarized light.

In accordance with one or more particular embodiments of the invention, an information processing system is provided which includes a processor, and instructions executable by the processor to perform a method in accordance with one or more of the embodiments described herein.

In accordance with one or more particular embodiments of the invention, a computer-readable recording medium is provided which has instructions recorded thereon, the instructions being executable by a processor to perform a method in accordance with one or more of the embodiments described herein.

A computer-implemented method of generating an electromagnetic field (EMF) correction boundary layer (BL) model corresponding to a mask is provided in accordance with an embodiment of the invention. In accordance with such embodiment, a computer can be used to perform a method which includes determining asymmetry factor data from aerial image measurements of a plurality of different gratings representative of features provided on a mask, wherein the aerial image measurements have been made at a plurality of different focus settings. The aerial image measurements can include X polarization measurements obtained by using light of an X polarization normal to a direction in which lines of the gratings extend, and Y polarization measurements obtained by using light of a Y polarization parallel to the direction in which the lines of the gratings extend. The method can further include determining normal boundary layer model parameters of an EMF correction BL model corresponding to the mask by fitting to the asymmetry factor data corresponding to the X polarization measurements. The method can further include determining parallel boundary layer model parameters of the EMF correction BL model corresponding to the mask by fitting to the asymmetry factor data corresponding to the Y polarization measurements.

In accordance with another embodiment of the invention, a computer-implemented method is provided for generating an electromagnetic field (EMF) correction boundary layer (BL) model corresponding to a mask, a computer being used to perform a method which can include determining asymmetry factor data from measurements of line widths of resist patterns, wherein the resist patterns correspond to images cast by a plurality of gratings at a plurality of different defocus distances, and the gratings are representative of features of a mask. The method can further include determining boundary layer parameters of an EMF correction BL model corresponding to the mask by fitting to the asymmetry factor data.

In accordance with one or more particular embodiments of the invention, the measurements of the resist patterns can be obtained by scanning electron microscopy.

In accordance with one or more particular embodiments of the invention, the step of determining asymmetry factor data can include determining first asymmetry factor data from measurements of the line widths of first patterns, wherein the first patterns being formed by X polarization light normal to a direction in which lines of a grating used to form the first patterns extend. The method can include determining second asymmetry factor data from measurements of the line widths of second patterns, wherein the second patterns are formed by Y polarization light parallel to a direction in which lines of a grating used to form the second patterns extend. Such method can include determining normal BL model parameters of an EMF correction BL model corresponding to the mask by fitting to the first asymmetry factor data, and such method can include determining parallel BL model parameters of the EMF correction BL model corresponding to the mask by fitting to the second asymmetry factor data.

In accordance with one or more particular embodiments of the invention, the step of determining asymmetry data can include determining first asymmetry factor data corresponding to first resist patterns formed using a first grating representative of first mask features, and can include determining second asymmetry factor data corresponding to second resist patterns formed using a second grating representative of second mask features. The step of determining BL model parameters can include determining feature-dependent BL model parameters including determining first feature-dependent BL model parameters by fitting to the first asymmetry data and can include determining second feature-dependent BL model parameters by fitting to the second asymmetry data. In such method, the first BL model parameters can differ from second BL model parameters in accordance with a difference between the first and second gratings.

DETAILED DESCRIPTION

One goal towards which an embodiment of the invention is directed is to generate an EMF-aware model of the mask, using less computing resources than heretofore.

Therefore, in accordance with an embodiment of the invention, a model of the mask, which accounts for electromagnetic field (EMF) effects, can be obtained by a procedure as follows. In one example, a thin mask approximation (TMA) model of the mask can be generated. AIMS measurements of the mask can be used to generate asymmetry factor data. Boundary layer (BL) model parameters can then be calibrated, i.e., determined, by fitting to the asymmetry factor data. The calibrated BL parameters can then be used in combination with a thin mask approximation (TMA) representation of the mask to generate a corrected mask model which accounts for EMF effects.

Figure 1:
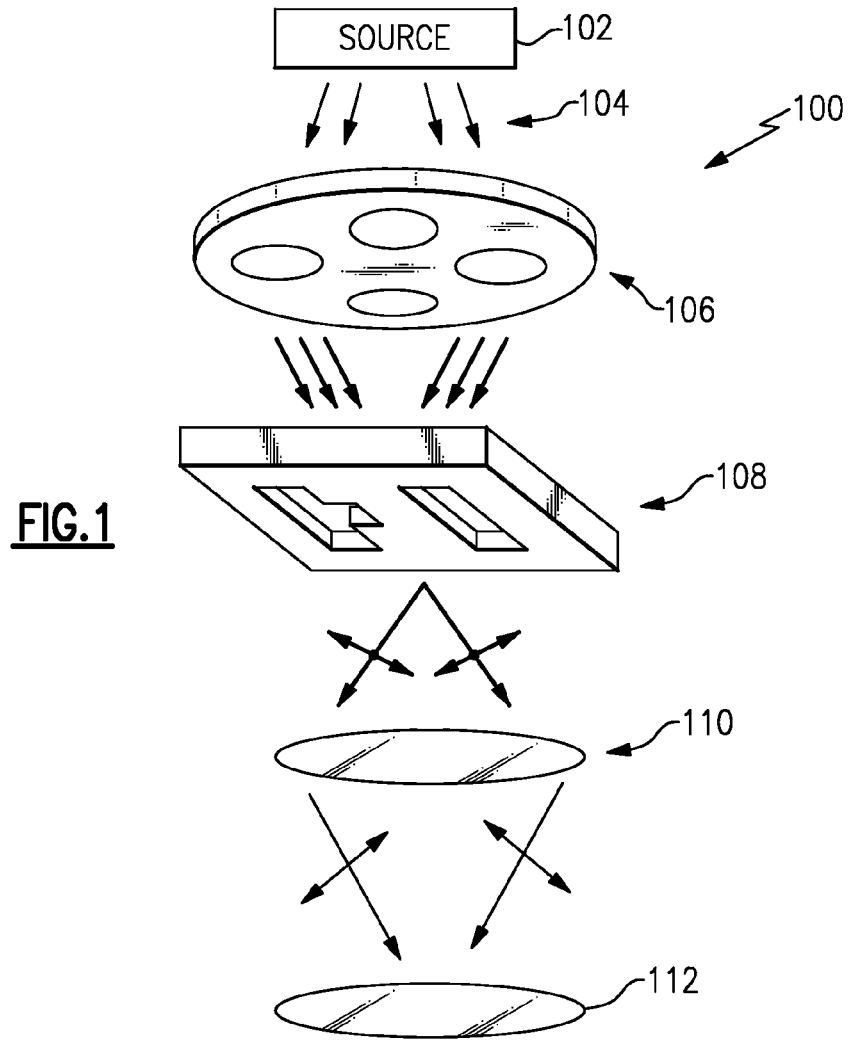
FIG. 1 is a diagram schematically illustrating elements of a photolithography exposure system used to create a photolithographic exposure on a layer of a substrate such as a semiconductor wafer.
Figure 2:
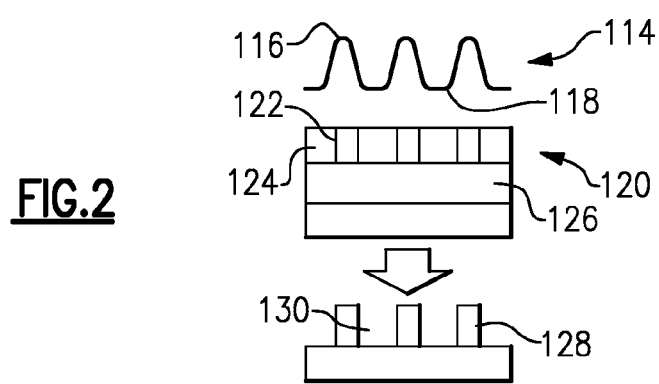
FIG. 2 is a diagram schematically illustrating the casting of an image onto a photoresist layer atop a substrate, and its use in forming a patterned layer of the substrate.

FIG. 1 illustrates a photolithography exposure system 100 as can be used in conducting advanced photolithography using an attenuating phase shift mask. As seen therein, light 104 from an illumination source 102 is directed through an aperture 106 and a mask 108 and then focused by optics 110 to cast an image onto a photoresist layer on a substrate 112, e.g., a semiconductor wafer. As further seen in FIG. 2, the image 114 contains a series of areas 116 at which the intensity of the light transmitted through the mask is high and a series of areas 118 at which the intensity of the light is negligible or low. The image makes an exposure of the photoresist layer 120 of the substrate. After exposure, the photoresist layer is subsequently processed with a developer. Under the assumption of a resist process with negative polarity, areas 122 of the photoresist layer which receive sufficient energy from the transmitted light remain as photoresist patterns, while areas 124 which do not receive sufficient energy are dissolved by the developer. The photoresist patterns can then be used to pattern an underlying layer 126 of material. The patterns which result from such process include lines 128 and spaces 130 between the lines. Alternatively, a resist process of positive polarity could be employed, where areas 122 of the photoresist layer which receive sufficient energy from the transmitted light are dissolved by the developer, while areas 124 which do not receive sufficient energy remain as photoresist patterns.

As mentioned above, the EMF effects can shift the locations of the edges of the printed features relative to the locations of the feature edges in the mask. Accordingly, when designing a mask, the EMF effects must be considered and accounted for. The degree to which the photolithography exposure created by the mask can be modeled accurately determines whether the actual image that is cast on the photoresist layer will be correct.

Figure 3A:
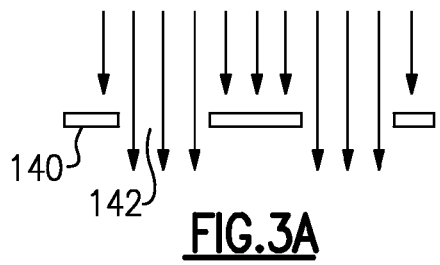
FIG. 3A is a sectional diagram schematically representing a TMA representation of a mask.
Figure 3B:
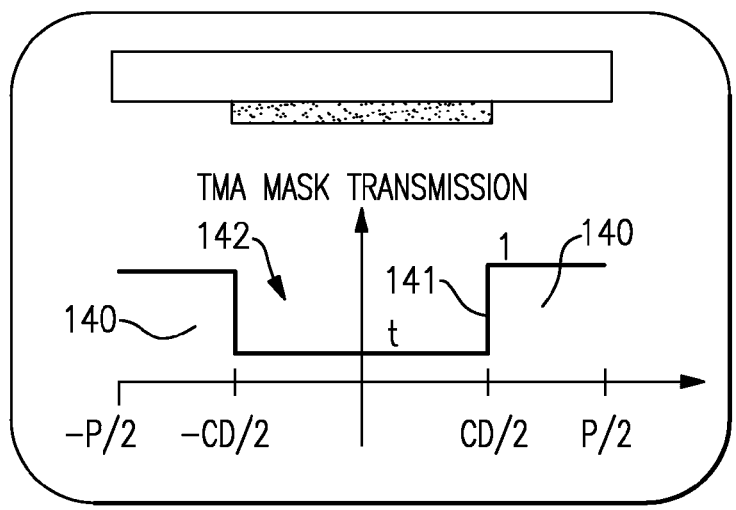
FIG. 3B is a graph illustrating dimensions of features in a TMA representation of a mask.
Figure 3C:
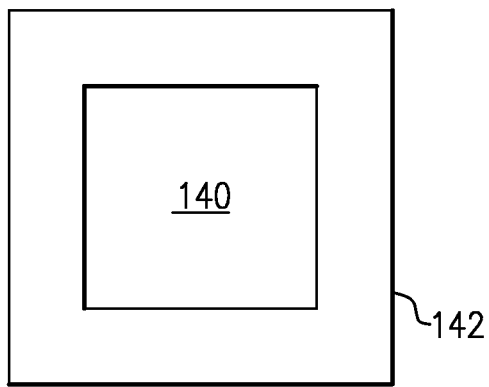
FIG. 3C is a plan view illustrating a feature in accordance with a TMA representation of a mask.
Figure 3D:
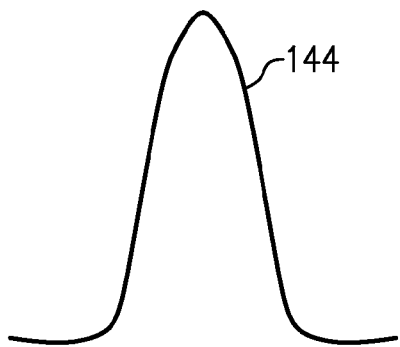
FIG. 3D is a graph of intensity produced in accordance with a TMA representation of a mask.

An existing way of representing a mask can be referred to as "thin mask approximation" ("TMA"). TMA is a technique in which the thicknesses of all features of a mask, i.e., the transparent substrate, opaque features, and the phase shift features, are ignored when modeling the image that is produced by the mask in photolithography. An example of this technique is illustrated in FIG. 3A, in which the transparent substrate is omitted, because it is considered to have zero thickness, and thus is not considered by the model. The remaining features are modeled as opaque features 140 of zero thickness which are capable of perfectly blocking the light, and transmitting features 142 between the opaque features. FIG. 3B illustrates TMA mask transmission in which a transmitting feature 142 of the mask is assumed to have width of value CD (e.g., critical dimension), and opaque features 140 of the mask completely block transmission, wherein the boundaries 141 between the transmitting feature and the opaque features are abrupt step changes. FIG. 3C is a corresponding plan view showing each gap 142 surrounded by opaque features 140. Using TMA, the modeled image produced (FIG. 3D) by the light transmitted through the gap 142 has intensity 144 which peaks at a point corresponding to the midpoint of the gap 142 between opaque features on each side of the gap.

Figure 5:
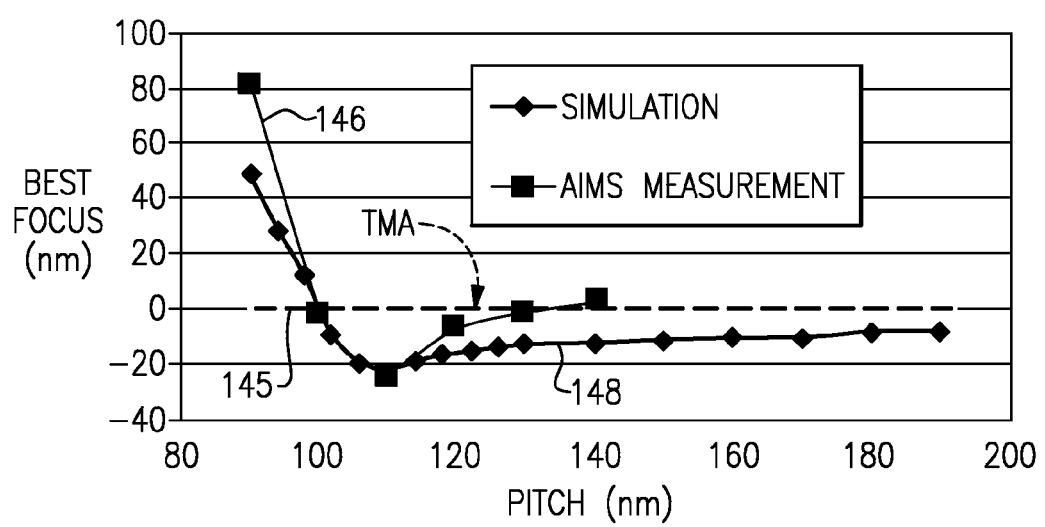
FIG. 5 is a graph illustrating determination of best focus using TMA, EMF simulation and AIMS measurements.

The plane of best focus when calculated using a TMA representation of a mask comes out the same for all values of pitch between features of the mask. For example, as seen in FIG. 5, the dashed line indicating the best focus 160 determined by a TMA representation of the mask is zero nanometers for all values of pitch. However, as pointed out above, the TMA representation of the mask does not properly account for the EMF effects. As further shown in FIG. 5, it is seen that the plane of best focus 162 as experimentally measured by an aerial image measurement system ("AIMS") is strongly positive for pitch less than 100 nanometers, then becomes negative for pitch above 100 nanometers and then gradually increases towards zero. In addition, when the plane of best focus is determined by rigorously computing the mask transmission using an electromagnetic solver that accounts for the optical properties and thickness of the mask, it is observed that the curve 164 displaying the plane of best focus obtained during simulation becomes strongly positive when the pitch decreases below 100 nanometers, is negative between 100 and 120 nanometers, and then levels off at zero for pitch greater than 120 nanometers. Thus, as seen in FIG. 5, rigorous electromagnetic mask transmission simulations produce a more accurate prediction of the plane of best focus across varying feature pitch as compared to experimental AIMS measurements than using a TMA representation of the mask.

Figure 4:
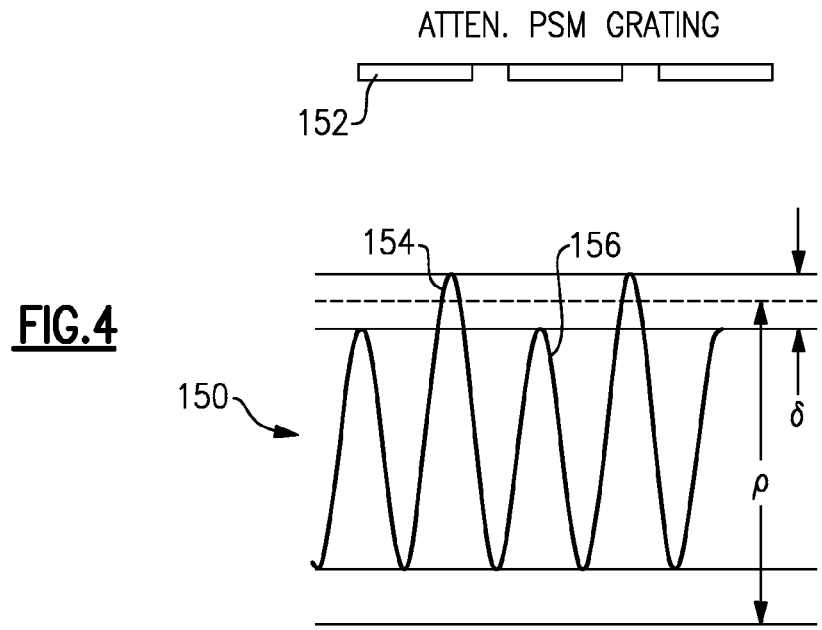
FIG. 4 is a diagram illustrating determination of an asymmetry factor.

Alternatively, the impact of mask topography on the aerial image intensity can be observed through measurements of the "asymmetry factor" of a phase shifting grating, which are known to exhibit high sensitivity to EMF effects. The "asymmetry factor" refers to a focus-dependent asymmetry in a nominally two-beam interference image, between adjacent peaks of the nominally sinusoidal fringe pattern, normalized by the DC intensity level (i.e. the average intensity in the image). This asymmetry factor exhibits a characteristic signature through focus that can be directly correlated to the impact of the mask EMF effects. The asymmetry factor can be determined by processing a series of aerial images of attenuating phase shift gratings recorded at different focal planes using an aerial image measurement system and determining the intensity of the aerial image at every point across a cross section. As seen in FIG. 4, when recording the aerial images of an attenuating phase shift mask (PSM) grating, a true image and a ghost image usually appear at each focal step, as seen in the plot of intensity 150 versus distance in a direction transverse to the lines 152 of the grating. The difference between the peak intensities 154 of the true image and the peak intensities 156 of the ghost image are calculated. This becomes the value $\delta$. The difference value $\delta$ can be normalized to the mean peak amplitude $\rho$ to form the asymmetry factor $\delta/\rho$.

Figure 6:
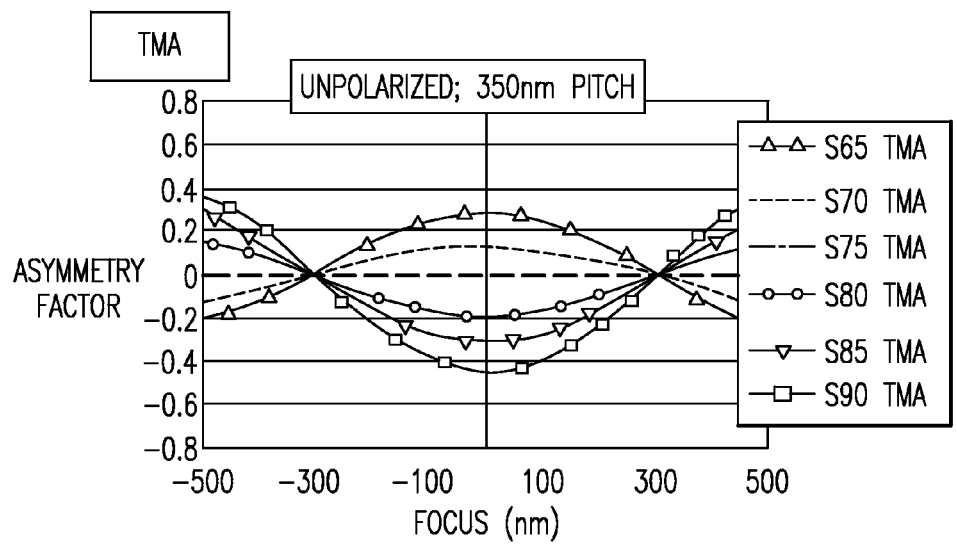
FIG. 6 depicts plots of asymmetry factor data obtained using a TMA representation of a mask.

FIG. 6 is a graph depicting asymmetry factor plots obtained using a TMA representation of a mask for a number of different gratings having the same pitch (350 nanometers at wafer scale, four times larger at mask scale) but different line widths in each case. The asymmetry factor plots were made for gratings having mask space features of widths of 65, 70, 75, 80, 85 and 90 nanometers (given at wafer scale) and illuminated with unpolarized light. As seen, in FIG. 6, the asymmetry factor plots vary with focus. However, all of the asymmetry factor plots reach local minima at focus values of −300 and +300 nanometers. In addition, each of the asymmetry factor plots reaches a local maximum at a focus value of zero.

Figure 7:
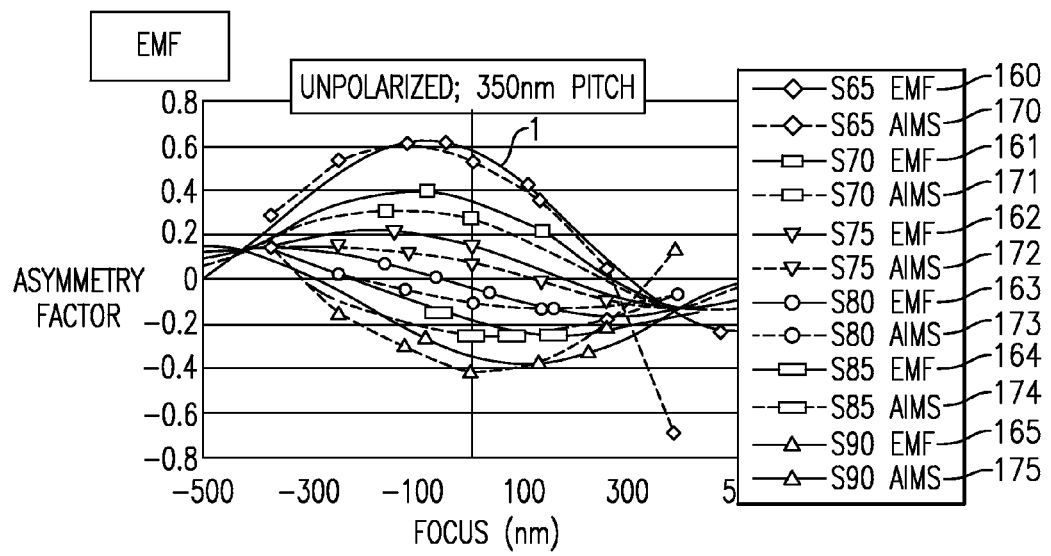
FIG. 7 depicts plots of asymmetry factor data obtained using a model of a mask obtained by simulation of the EMF effects and obtained through AIMS measurements.

One problem with the determination of the asymmetry factor plots using a TMA representation as seen in FIG. 6 is that the technique inadequately accounts for the EMF effects on the mask topography. FIG. 7 illustrates asymmetry factor plots 160, 161, 162, 163, 164, and 165 obtained by conducting rigorous simulation of the transmission through the mask for a series of gratings each having 350 nanometer pitch at wafer scale, but different mask space widths of 65, 70, 75, 80, 85 and 90 nanometers (given at wafer scale) in the respective cases. The plots represent asymmetry factor results which account for the EMF effects when unpolarized light is used. FIG. 7 also illustrates asymmetry factor plots 170, 171, 172, 173, 174, and 175 calculated from aerial image measurements (AIMS measurements) for a series of gratings each having 350 nanometer pitch at wafer scale, but different mask space widths of 65, 70, 75, 80, 85 and 90 nanometers (wafer scale) in the respective cases, and exposed with unpolarized light. As seen in FIG. 7, the plots no longer reach local minima and maxima at the same focus values. Instead, there is a pronounced shift in the maximum towards negative focus for smaller line width values of 65 and 70 nanometers, and a pronounced shift in the maximum towards positive focus for larger line width values of 85 and 90 nanometers. The quadratic response through focus in FIG. 7 (curve bow at the focus origin) indicates unbalanced transmission error, while linear response (curve tilt at the origin) indicates phase error. Moreover, the enhanced accuracy of the asymmetry factor calculations when obtained using rigorous EMF simulations as compared to the asymmetry factor plots obtained from experimental aerial image measurements using an AIMS tool indicate that TMA simulations are not accurate enough to model the electromagnetic response of the reticle.

Figure 8:
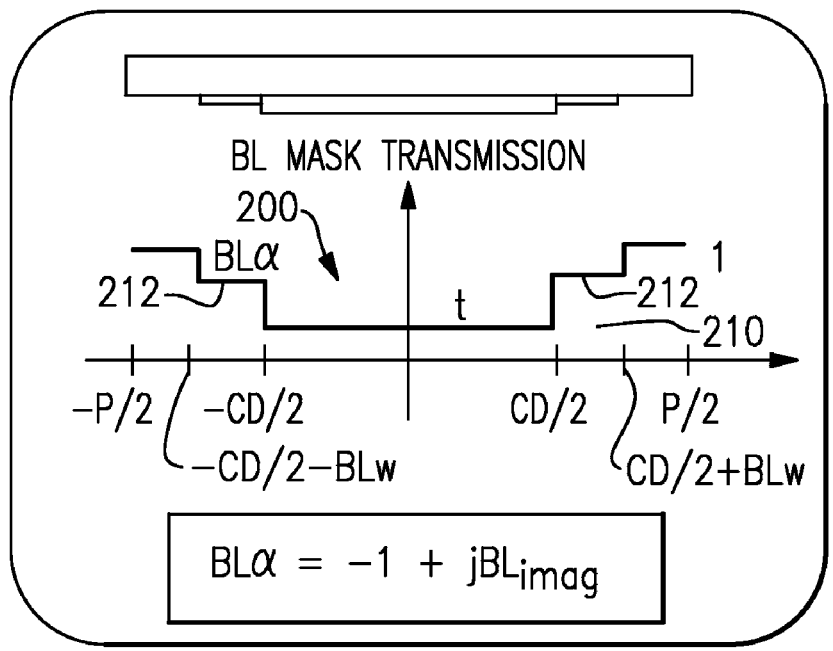
FIG. 8 is a graph illustrating dimensions of features in a boundary layer model of a mask.

A boundary layer (BL) model is a technique used to account for EMF effects when modeling transmission through the mask. The boundary layer (BL) model has been shown capable of mimicking EMF effects like those seen in FIG. 1(b) at the scale of the lens resolution. Referring to FIG. 8, in a boundary layer model, each light transmitting feature of a mask, i.e., a space between opaque features, can be modeled as an opening 200 of width "CD" between opaque features 210 of the mask as in conventional TMA models. In addition, in the boundary layer model the opaque features further include a strip 212 of width W and complex transmission around the perimeter of the opening. Thus, the boundary layer model adds little computational complexity to the simple Thin Mask Approximation. Conventionally, BL models use different model parameters for each orientation of the mask opening edge relative to the incident light polarization, adding only a fixed width strip to every edge that is locally-determined based on the edge orientation. The boundary layer can be described by complex parameters which model for thick mask effects, different polarizations, and account for phase errors on the aerial image by permitting a complex transmission coefficient in the boundary layer area. Without loss of generality, the BL width is by convention scaled for local mask blank transmission, so that the overall real part of the transmission through the boundary layer equals the mask transmission. Stated another way, the real part of the transmission through the boundary layer is zero for a purely opaque mask. This results in a boundary layer with a purely imaginary transmission. The width of the boundary layer ($BL_{width}$) controls the variations in peak amplitude, while the imaginary transmission ($BL_{imag}$) corrects for phase deviations due to the 3-D topography. Thus, the overall transmission through the BL model can be described in terms of these two BL parameters, $BL_{width}$ and $BL_{imag}$, as:

$$BL\alpha = -1 + jBL_{imag}, \text{ where } j \text{ is } \sqrt{-1}. \quad \text{(eq. 1)}$$

Specifically, the boundary layer model parameters relate to a normalized difference $\Delta E/E$ at the peak of the aerial image electric field amplitude. That is the difference between the image produced by the TMA model and the image produced by a the rigorously computed electromagnetic transmission through the mask openings, $\Delta E = (E^{TMA} - E^{EMF})$, normalized to the TMA aerial image electric field as follows:

$$\text{Amplitude Deficit} = \text{Re}\left\{\frac{\Delta E}{E^{TMA}}\right\} = -\frac{2BL_{width}}{w} \quad \text{(eq. 2a)}$$

$$\text{Imaginary Error} = \text{Im}\left\{\frac{\Delta E}{E^{TMA}}\right\} = -BL_{imag}\frac{2BL_{width}}{w} \quad \text{(eq. 2b)}$$

Aerial image simulations that use the boundary layer model in combination with the mask TMA representation produce image results that more accurately predict those obtained using rigorous electromagnetic computations or through experimental measurements than when using only the TMA representation.

Figure 9:
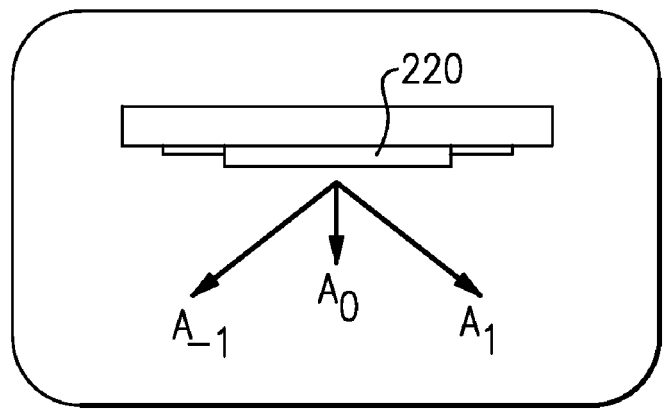
FIG. 9 is a diagram illustrating beams considered in the determination of EMF effects of a mask modeled with a BL model.

The availability to use boundary layer model parameters to correct a TMA representation of a mask is apparent from the following. When using a TMA representation of a mask, the following equations can be used to obtain the asymmetry factor. For dense pitch grating such that the aerial image is formed by the interference of only the three diffraction orders that propagate inside the numerical aperture of the lens, and assuming a coherent plane wave illumination, normally incident on the mask, then the aerial image electric field can be described by:

$$E = A_0 \cdot e^{-jk_0 z} + A_1 \cdot e^{jk_x x} \cdot e^{-jk_z z} + A_{-1} \cdot e^{-jk_x x} \cdot e^{-jk_z z}, \quad \text{(eq. 3)}$$

where $A_0$, $A_1$ and $A_{-1}$ represent complex amplitude of the three interfering beams of light as diffracted by the photomask. As seen in FIG. 9, $A_0$ is oriented in the direction of the incident illuminating wave, representing the zeroth diffracted order, while $A_1$ and $A_{-1}$ represent the +/− first diffracted orders propagating in the directions described by the wavevectors $k_{\pm 1} = (\pm k_x \hat{x} + k_z \hat{z})$. The vector $k_0 = 2\pi/\lambda$ represents the wavevector in free space, and under normal incidence we can assume $A_1 = A_{-1}$. Under the TMA representation we find:

$$I_{image} = A_0 A_0^* + A_1 A_1^* 4 + 4A\cos(k_z - k_0)z \quad \text{(eq. 4a)}$$

$$\text{with } A = -4\rho \operatorname{sinc}(\rho\pi)(1-t)[1-\rho(1-t)] \text{ and } \rho = \frac{CD}{P} \quad \text{(eq. 4b)}$$

$$\text{giving } AsymFactor = \frac{8A\cos(k_z - k_0)z}{(A_0 A_0^* + 4A_1 A_1^*)} \quad \text{(eq. 4c)}$$

Assuming that the effect of the topography on the beams diffracted by the photomask can be described as a perturbation, $\Delta A_0^{EMF}$, of the diffracted orders computed under the TMA representation, $A_0^{TMA}$, then we arrive to the following more rigorous expression for the beams diffracted by the photomask:

$$A_o = A_0^{TMA} + \Delta A_0^{EMF} \text{ and } A_1 = A_1^{TMA} + \Delta A_1^{EMF} \quad \text{(eq. 5)}$$

and the expression for the aerial image intensity produced by the interference of three propagating beams becomes:

$$I_{image} = A_0 A_0^* + 4A_1 A_1^* + 4A''\cos(k_z - k_0)z - 4B''\sin(k_z - k_0)z \quad \text{(eq. 6a)}$$

$$\text{with } A_1 A_0^* = A + (A^{EMF} + jB^{EMF}) = (A'' + jB''). \quad \text{(eq. 6b)}$$

where coefficients $A^{EMF}$ and $B^{EMF}$ can be seen to be consequence of the EMF effects present on the mask and represented as a perturbation $\Delta A_0^{EMF}$ and $\Delta A_1^{EMF}$ over the conventional TMA diffraction orders. In this case, the asymmetry factor can be analytically formulated as a function of the EMF-induced coefficients:

$$AsymFactor = \frac{8(A + A^{EMF})\cos(k_z - k_0)z - 8B^{EMF}\sin(k_z - k_0)z}{(A_0 A_0^* + 4A_1 A_1^*)}. \quad \text{(eq. 6c)}$$

A boundary layer model can be used to correct a TMA representation of a mask such that it reproduces the diffracted fields as produced by a rigorous electromagnetic simulation of the true EMF effects. Thus, we can assume the effect of applying a boundary layer model as a perturbation over the diffracted beams produced by the TMA representation as follows:

$$A_o = A_0^{TMA} + \Delta A_0^{BL} \text{ and } A_1 = A_1^{TMA} + \Delta A_1^{BL} \quad \text{(eq. 7)}$$

with the aerial image intensity produced by the interference of these three beams as:

$$I_{image} = A_0 A_0^* + 4A_1 A_1^* + 4A'\cos(k_z - k_0)z - 4B'\sin(k_z - k_0)z \quad \text{(eq. 8a)}$$

$$\text{with } A_1 A_0^* = A + (A^{BL} + jB^{BL}) = (A'jB'). \quad \text{(eq. 8b)}$$

In this case, the expression for the asymmetry factor in terms of the BL-induced perturbations becomes:

$$AsymFactor = \frac{8(A + A^{BL})\cos(k_z - k_0)z - 8B^{BL}\sin(k_z - k_0)z}{(A_0 A_0^* + 4A_1 A_1^*)}. \quad \text{(eq. 8c)}$$

The inventors have found that the parameters used in a boundary layer model, i.e., width ($BL_{width}$) and transmission ($BL_{imag}$), need not be obtained by simulation or computationally intensive calculations that also require a detailed knowledge of the mask optical and geometric characteristics. Rather, the parameters can be calibrated to asymmetry factor measurements obtained by AIMS measurements. Therefore, in accordance with an embodiment of the invention, a model of the mask, corrected so that it accounts for electromagnetic field (EMF) effects, can be obtained by a procedure as follows. In one example, a thin mask approximation (TMA) model of the mask can be generated. AIMS measurements of the mask can be used to generate asymmetry factor data. Boundary layer (BL) model parameters: width and transmission can then be calibrated to the asymmetry factor data, e.g., by a fitting technique, such that the BL parameters minimize the difference between simulated aerial image asymmetry factor using the BL model and the measured asymmetry factor data. The calibrated BL parameters can then be used with a thin mask approximation (TMA) representation of the mask to generate a corrected mask design which is pre-compensated to account for EMF effects. Moreover, corrected mask model can be generated in this way with sufficient accuracy while maintaining the speed of a TMA model. In one embodiment, the calibrated BL model parameters can be used to generate a corrected mask model which pre-compensates for EMF effects in an entire category of masks in which the mask substrate and the opaque and phase-shifting features have the same materials, construction, thickness and width. A corrected mask model generated in this way can then be used as models of the mask transmission during mask manufacturing and development processes, i.e., such as optical proximity correction (OPC) processing, which can be performed using full chip algorithms, as well as optimization through simulations of the lithography process.

Figure 10:
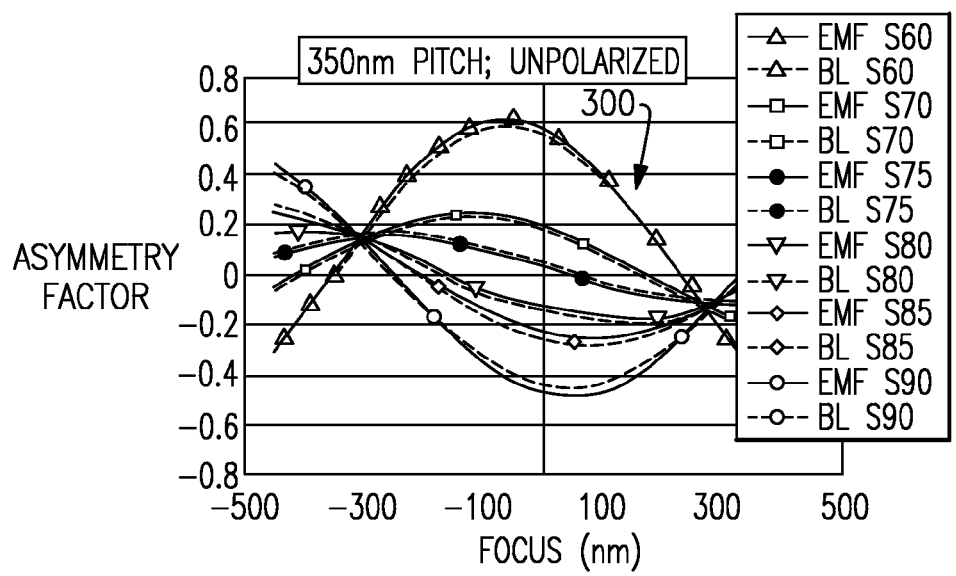
FIG. 10 depicts plots of asymmetry factor obtained by AIMS measurements, and the fitting of BL model parameters thereto.

FIG. 10 depicts a series of asymmetry factor plots 300 obtained using AIMS measurements for a series of gratings all having the same pitch (350 nanometers at wafer scale, four times larger at mask scale), and each grating including mask open space features having different widths, as follows: 60, 70, 75, 80, 85 and 95 nanometers at wafer scale. For the plots shown in FIG. 10, the AIMS measurements are obtained using unpolarized light. Boundary layer ("BL") model parameters then can be calibrated by fitting to the asymmetry factor plots. The fitting can be carried out as follows. Simulations can be performed to determine the aerial image intensity corresponding to each of the structures, e.g., the gratings, for which AIMS measurements have been made. The simulations can be performed using a "trial" or candidate set of BL parameters to be tested. Using the trial BL parameters, asymmetry factor plots can be calculated for the set of simulated aerial images to yield a set of simulated asymmetry factors. Differences can then be calculated between the simulated asymmetry factors and the asymmetry factors determined from actual AIMS measurements of the mask This process can be repeated in an iterative manner, each time changing the BL parameters slightly at each iteration. The iterative testing of candidate BL parameters can be conducted either exhaustively within a pre-defined parameter space, or using an available optimization algorithm until the differences between the asymmetry factor plot derived by simulation and that derived from actual AIMS measurement is minimized to a value smaller than a pre-defined threshold.

As an alternative to using the above-described technique, the BL parameters can be correlated with EMF-induced perturbation. Specifically, in this case, equations 6c and 8c can be used to determine the correct BL model parameters by correlation with EMF-induced perturbation through the explicit expressions therein of the coefficients $A^{EMF}$, $B^{EMF}$ and $A^{BL}$, $B^{BL}$.

Figure 11:
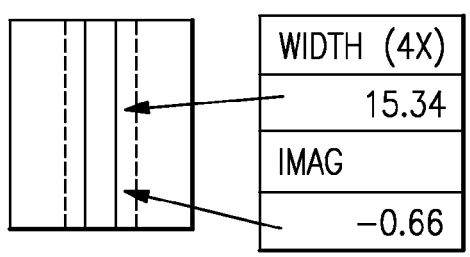
FIG. 11 is a diagram illustrating the application of BL model parameters to mask features.

FIG. 11 provides an example of a set of BL parameters obtained for attenuated phase-shifting masks of certain thickness, optical constants and mask profile geometry. Using one or more of the above fitting or correlation techniques, the width of the boundary layer determined from asymmetry factor data (e.g., FIG. 10) may be 15.34 nanometers. In this case, BL width typically is provided as a mask scale dimension, i.e., a dimension which is four times (4×) the dimension of a corresponding feature printed on the wafer. As also indicated in FIG. 11, the imaginary part of the boundary layer transmission parameter is –0.66, which compares to a transmission value of 1.0 through the clear openings of the mask.

In one embodiment, the same two simple BL parameters in FIG. 11, width and transmission (imaginary part), can be used for all cases of mask absorber width plotted in FIG. 10 with sufficient accuracy. This follows from recognition that electromagnetic field effects can be assumed to be largely confined to a vicinity of an edge of the mask topography. Specifically, electromagnetic field effects can be considered to be an edge field correction, i.e., a correction using a boundary layer which considered to be present along the rim of a polygon, with the properties of the correction varying only depending on the orientation of the edge relative to some given polarization orientation.

However, at the deep subwavelength regimes at which optical lithography currently operates, this edge-effect assumption is exhibiting inaccuracies introduced by the close proximity of adjacent edges. In such case, a need exists to determine sets of BL model parameters which vary depending upon the size of features on the mask. To determine the sets of BL parameters, in this case, AIMS measurements can be obtained like those represented by asymmetry factor plots 300 (FIG. 10), which differ for each grating depending upon the space width of the open space features therein. When the line widths of mask features are particularly small, and may even have subwavelength dimensions, sets of the BL model parameters can be calibrated in a feature-dependent way. Specifically, a set of BL model parameters can be determined by fitting to asymmetry factor data obtained for features having a first width, for example, open space features having a width of 60 nanometers at wafer-scale. Another set of BL model parameters can be determined by fitting to asymmetry factor data for features having a second width, for example, open space features having a width of 70 nanometers at wafer-scale. In this way, a number of sets of BL model parameters can be determined, each set of which can differ depending upon the width of the features, e.g., the width of space line features of the grating. In this way, the corrected mask model can improve accuracy. For example, calibrated feature-dependent BL model parameters can enhance accuracy of the mask model by addressing inaccuracies introduced by close proximity of adjacent edges.

In one example, the calibrated boundary layer model parameters in this case can then be used to generate an electromagnetic field (EMF) correction model for use in photolithography exposure simulation systems which use unpolarized light. In one example, the EMF correction model can be generated by applying the calibrated boundary model parameters to a TMA representation of the mask. Then, the EMF correction model can be used during optical proximity correction runs to generate a design of the mask which is accurately pre-compensated for EMF effects.

Figure 12:
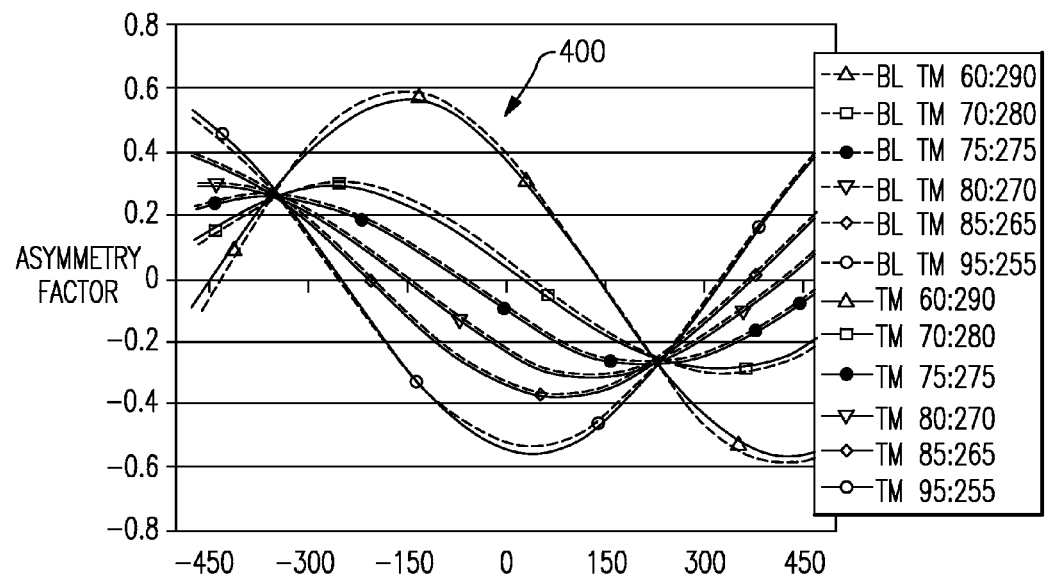
FIG. 12 depicts plots of asymmetry factor obtained by rigorous computation of Maxwell electromagnetic equations using light having normal polarization, and the fitting of BL model parameters thereto.
Figure 13:
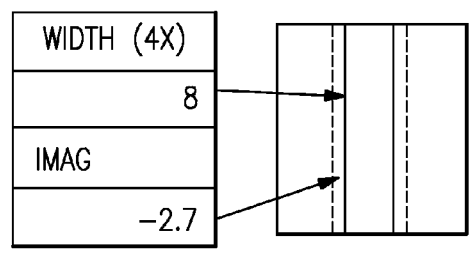
FIG. 13 is a diagram illustrating the application of BL model parameters to mask features for light having normal polarization.

Referring to FIGS. 12 through 13, boundary layer model parameters can also be determined for photolithography systems which use polarized light. In this case, aerial image measurements can be obtained by AIMS by illuminating the mask using light of a polarization normal to a lengthwise direction of opaque line features of the grating. Measurements can be made of different gratings using light having an X-polarization which is normal to the lengthwise direction of the line features. Stated another way, the X-polarization is aligned with the widthwise direction of the opaque line features of the grating. In the example of FIG. 12, the measurements correspond to gratings wherein the pitch of the opaque features of each grating (350 nanometers at wafer scale, four times larger at mask scale) is constant for all gratings, but the widths of the open space features in each respective grating are 60, 70, 75, 80, 85, and 95 nanometers at wafer scale. FIG. 12 shows plots 400 of the asymmetry factor for each of the gratings having these different space widths. Then, from the data obtained regarding the asymmetry factor using the X-polarization light, BL model parameters can be determined for the normal (X) polarization. FIG. 13 illustrates the determination of BL model parameters for the normal (X) polarization. FIG. 13 shows that, in this example, the width of the BL model parameters is 8 nanometers at mask scale and the imaginary transmission of the BL model parameters is –2.7 (as compared to a transmission of 1 through the clear openings of the mask). The BL model parameters obtained in this case can be used to account for EMF effects when the polarization of the light used to make a photolithographic exposure is normal to the lengthwise direction of line features of the grating, or is normal to the edge of any arbitrary feature being modeled with the BL strip.

Figure 14:
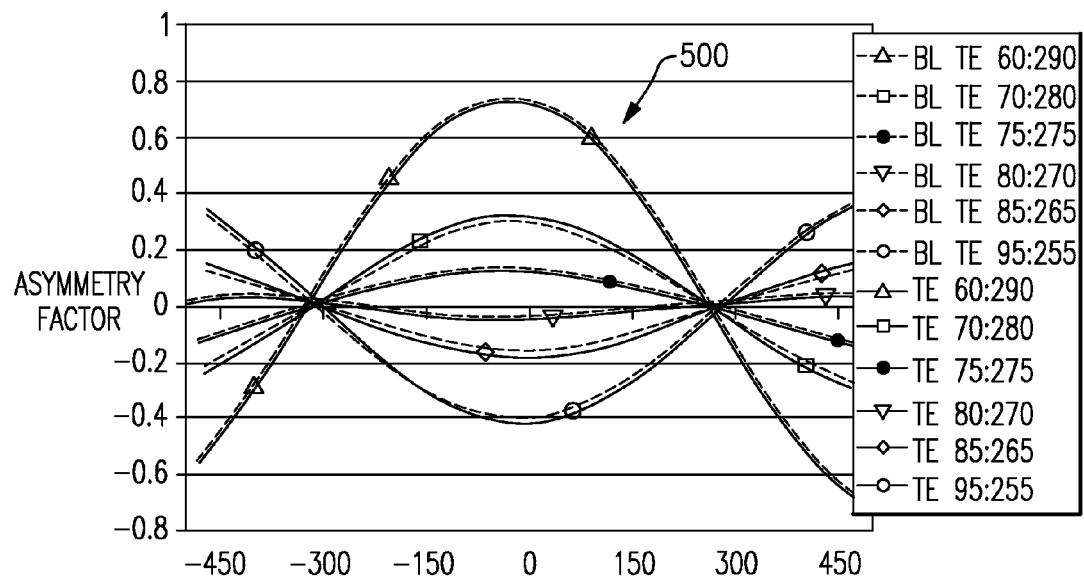
FIG. 14 depicts plots of asymmetry factor obtained by rigorous computation of Maxwell electromagnetic equations using light having parallel polarization, and the fitting of BL model parameters thereto.
Figure 15:
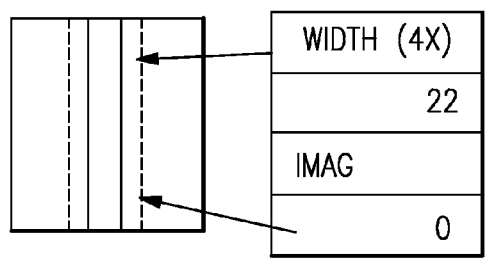
FIG. 15 is a diagram illustrating the application of BL model parameters to mask features for light having parallel polarization.

Similarly, referring to FIGS. 14 and 15, the BL model parameters can be determined for the Y-polarization, that is, the parallel polarization, or the polarization of light which is parallel to the lengthwise direction of the opaque line features of the gratings. In this case, aerial image measurements can be obtained by AIMS by illuminating the mask using light of a polarization parallel to the lengthwise direction of the opaque line features of the grating. Measurements can be made of different gratings using light having an Y-polarization which is parallel to the lengthwise direction of the line features. In example of FIG. 14, the measurements correspond to gratings wherein the pitch of the opaque features of each grating (350 nanometers at wafer scale, and 4 times larger at mask scale) is constant for all gratings, but the space widths of the open space features in each respective grating are 60, 70, 75, 80, 85, and 95 nanometers at wafer scale. FIG. 14 shows plots 500 of the asymmetry factor for each of the gratings having these different space widths. Then, from the data obtained regarding the asymmetry factor using the Y-polarization light, BL model parameters can be determined for the parallel (Y) polarization. FIG. 15 illustrates the determination of BL model parameters for the parallel (Y) polarization. FIG. 15 shows that, in this example, the width of the BL model parameters is 22 nanometers at mask scale and the imaginary transmission of the BL model parameters is nearly 0 (that is, the transmission through the BL is the same as the transmission through the absorber, which will be 0 for completely opaque masks). The BL model parameters obtained in this case can be used to account for EMF effects when the polarization of the light used to make a photolithographic exposure is parallel to the lengthwise direction of line features of the grating.

In a variation of the above-described embodiment (FIGS. 12-15), aerial image measurements obtained using light of different polarizations can be combined to obtain isotropic BL model parameters which can be used to account for EMF effects when unpolarized light is used to make the exposure. In this case, calibrated isotropic BL model parameters can be generated by coherently combining the calibrated BL model parameters for each of the parallel and normal polarizations obtained, for example, by the above-described methods (FIGS. 12 through 15). Then, an electromagnetic field (EMF) correction model can be generated using the isotropic BL model parameters thus obtained. A corrected model of the mask can then be generated using the EMF correction model, wherein the corrected mask model accounts for EMF effects relative to unpolarized light.

Figure 16:
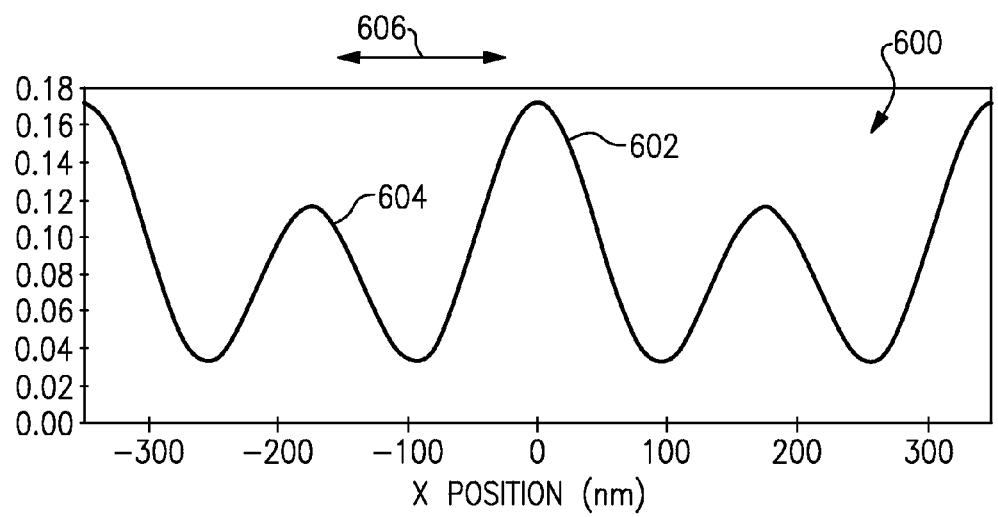
FIG. 16 is a graph illustrating intensity versus wafer position of an image cast by a grating with defocus applied.
Figure 17:
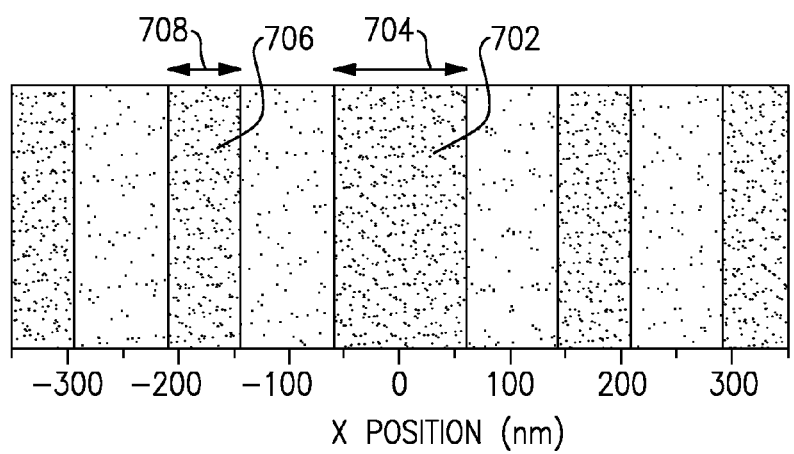
FIG. 17 is a plan view illustrating a pattern formed in a photoresist layer in accordance with an image cast by a grating of a mask.

FIGS. 16 and 17 illustrate determination of BL model parameters using an alternative approach in which the asymmetry factor measurements are obtained from a patterned photoimageable resist layer on a substrate, instead of from aerial image intensity measured in the vicinity of the imaging focal plane with an AIMS tool. For this approach, a similar phase shifting grating as used in FIG. 4 and in the above examples is used to expose a layer of photoresist. The difference in intensity between adjacent fringes 604 and 602 or peaks in the aerial image 600 produced by such a grating is illustrated in FIG. 16. As a result, the peak intensity is higher in some locations 602 than it is in other locations 604 which separated therefrom by half the pitch of the mask grating (at wafer scale) in a direction 606, the direction being normal to the lengthwise direction of the grating's opaque line features. The resist layer receives an exposure equal to the aerial image 600 at the imaging focal plane. When the exposed photoresist layer is developed, this asymmetric aerial image intensity translates into adjacent resist lines 704 and 708 having different widths as illustrated in FIG. 17. Specifically, as seen in FIG. 17, resist line 702 has greater width 704 than the width 708 of resist line 706. Moreover, when the photoresist layer is exposed at varying defocus positions (i.e., intentional offset from best focus), the intensity 600 of the image that is cast on the photoimageable resist layer varies with defocus distance, and the relative peak intensities oscillate relative to each other. Then, the patterns which result in the photoresist layer 700 (FIG. 17) have linewidths that vary with the defocus distance.

Figure 18A:
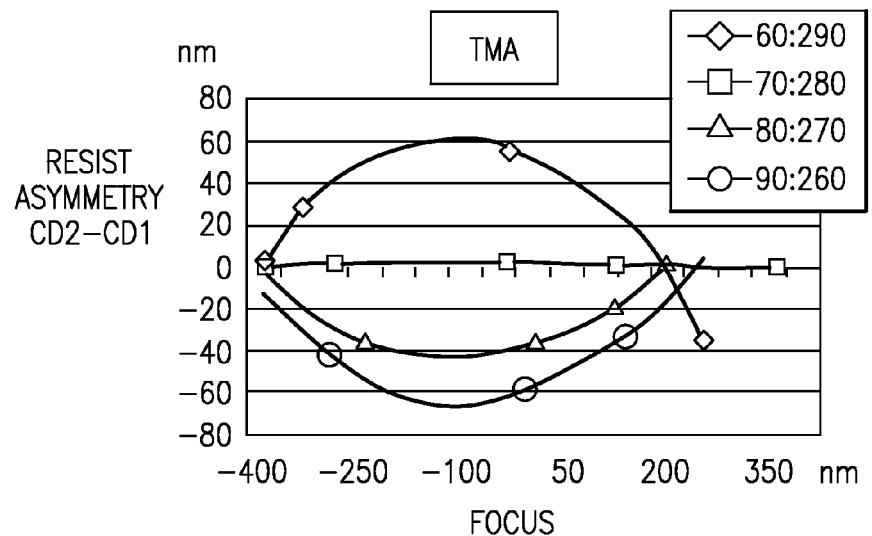
FIG. 18A depicts plots of resist asymmetry factor obtained using a TMA representation of a mask.

The linewidths 704, 708 of adjacent resist lines can be referred to as "CD1" and "CD2", these linewidths typically being at or close to a critical dimension for the wafer being patterned. FIG. 18A shows a simulated resist asymmetry defined by the difference in linewidths (CD2–CD1) using a TMA representation of the mask. Using a TMA representation of the mask, the resist asymmetry obtained by simulation results in a set of plots having shape similar to those of FIG. 6 described above. The four plots in FIG. 18A correspond to each of four different mask gratings, in which the pitch of the lines in each grating is 350 nm (wafer-scale), and the width of the open spaces of the gratings are 60 nm, 70 nm, 80 nm and 90 nm, respectively, at wafer scale. The simulated resist asymmetry obtained using a TMA representation of the mask (FIG. 18A) does not accurately reflect the actual resist asymmetry obtained by measuring linewidths of actual patterns printed using a set of mask gratings.

Figure 18B:
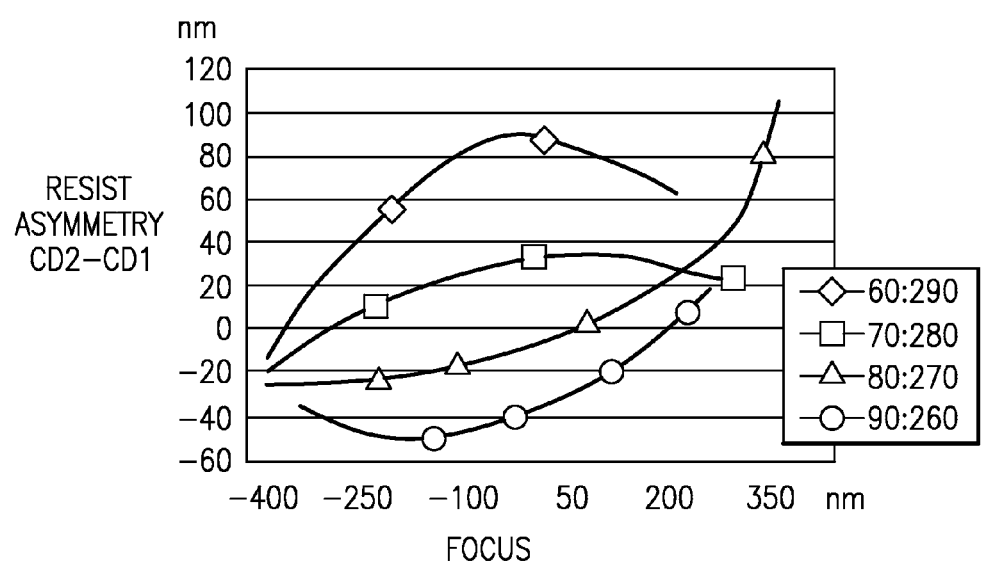
FIG. 18B depicts plots of resist asymmetry factor obtained from measurements of line widths of photoresist patterns.

As further shown in FIG. 18B, the resist asymmetry (CD2–CD1) determined from SEM measurements of actual resist linewidths exhibits asymmetry which is equivalent to the asymmetry factor data determined from aerial image measurements of the mask according to one of the above-described embodiments. As in the above-described method, the resist linewidths can be measured using scanning electron microscopy (SEM) for several different patterns which are printed using a set of mask gratings having lines of different widths. As is the case in FIG. 18A, the four plots shown in FIG. 18B correspond to each of four different mask gratings, in which the pitch of the lines in each grating is 350 nm (wafer-scale), and the width of the open spaces of the gratings is 60 nm, 70 nm, 80 nm and 90 nm at wafer-scale, respectively. Therefore, in the present embodiment (FIGS. 16-18B), BL parameters can be determined from the measured asymmetry in resist linewidth obtained by SEM rather than from AIMS measurements.

By using different gratings of a mask to print photoresist patterns at different defocus values, a series of photoresist patterns can be obtained from which asymmetry factor plots can be made using photoresist linewidth measurements following a procedure as described above, and then calibrating a BL model in a manner similar to that of the above-described embodiments (FIGS. 10-11 or FIGS. 12-15). Subsequently, the steps performed in such method can be the same or similar as those performed in one of the above-described embodiments (FIGS. 10-11 or FIGS. 12-15). For example, the a set of resist patterns can be formed using unpolarized light and the step of determining BL model parameters can include determining BL model parameters which are isotropic by fitting to asymmetry factor data obtained from measurements of the set of resist patterns.

Specifically, in a particular embodiment herein, normal BL model parameters corresponding to normal (X) polarization light, and parallel BL model parameters corresponding to parallel (Y) polarization light can be obtained. In such embodiment, the step of forming resist patterns can include forming a first set of patterns using light of an X polarization which is normal to a direction in which lines of the gratings extend, and forming a second set of patterns using light of a Y polarization which is parallel to a direction in which the lines of the gratings extend. Then, first asymmetry factor data can be determined from measurements of the line widths of the patterns formed by the X polarization light, second asymmetry factor data can be determined from measurements of the line widths of the patterns formed by the Y polarization light. The normal BL model parameters can be obtained by fitting to the first asymmetry factor data, and the parallel BL model parameters can be obtained by fitting to the second asymmetry factor data.

It is also possible to obtain feature-dependent BL model parameters which differ in accordance with differences between first mask features and second mask features being modeled. In such embodiment, first resist patterns can be formed using a first grating representative of first mask features, and second resist patterns can be formed using a second grating representative of second mask features. Then, the step of determining asymmetry factor data can include determining first asymmetry factor data corresponding to the first resist patterns, and determining second asymmetry factor data corresponding to the second resist patterns. The step of determining BL model parameters can include determining feature-dependent BL model parameters. Such method can include determining first BL model parameters by fitting the first asymmetry data, and determining second BL model parameters by fitting to the second asymmetry data. In this case the first BL model parameters may differ from the second BL model parameters in accordance with a difference between the first and second gratings.

Heretofore, simulation-based methods for calibrating a BL model of EMF effects of a mask have required thorough characterization of the mask profile and optical parameters, which is often not available or require intensive and complex mask metrology. The embodiments provided herein allow BL model parameters for EMF model calibration to be extracted from data obtained through actual aerial image measurements, with direct correlation to the actual mask optical parameters. In this way, the need for accurate characterization of the mask can be relaxed. In a particular method, a BL model could be tuned to each mask built by including in the mask a set of grating test targets for calibration, hence customizing the model to the exact mask characteristics, such as sidewall angles, exact thickness, or other characteristic.

Determination of boundary layer width and transmission parameters for different illumination polarizations can provide an accurate first order representation of the effects of mask topography for all edges on the mask illuminated with said polarization. In accordance with the above-described embodiments, the parameters can be obtained simply from a few AIMS or wafer measurements. More advanced BL models that require feature-dependent BL parameters can also be calibrated to asymmetry factor plots of a set of mask structures, which are representative of different features to be modeled. For example, very small features such as sub-resolution assist features ("SRAFs") require more advanced BL models. BL model corrected mask representations are compatible with EDA (electronic design automation) vendors' existing implementations of EMF models and hence, permit use of an EMF model calibrated to empirical data, such as data obtained from mask or resist pattern measurements as described herein.

Finally, it can be noted that the widths of resist lines that result when printing a test target on a wafer are subject to various unexpected error and inaccuracy in accordance with the chemistry of the photoresist, the capabilities of the photoresist process model, and other influences. In the face of these sources of error, in a conventional method of extracting BL parameters from resist linewidth measurements, a large number of SEM measurements of printed grating test targets has been required. In contrast, as provided in accordance with embodiments of the invention herein, calibration of BL model parameters by fitting to asymmetry factor data that exhibits a distinct response to EMF effects can provide accurate results even when using a relatively small number of gratings.

Figure 19:
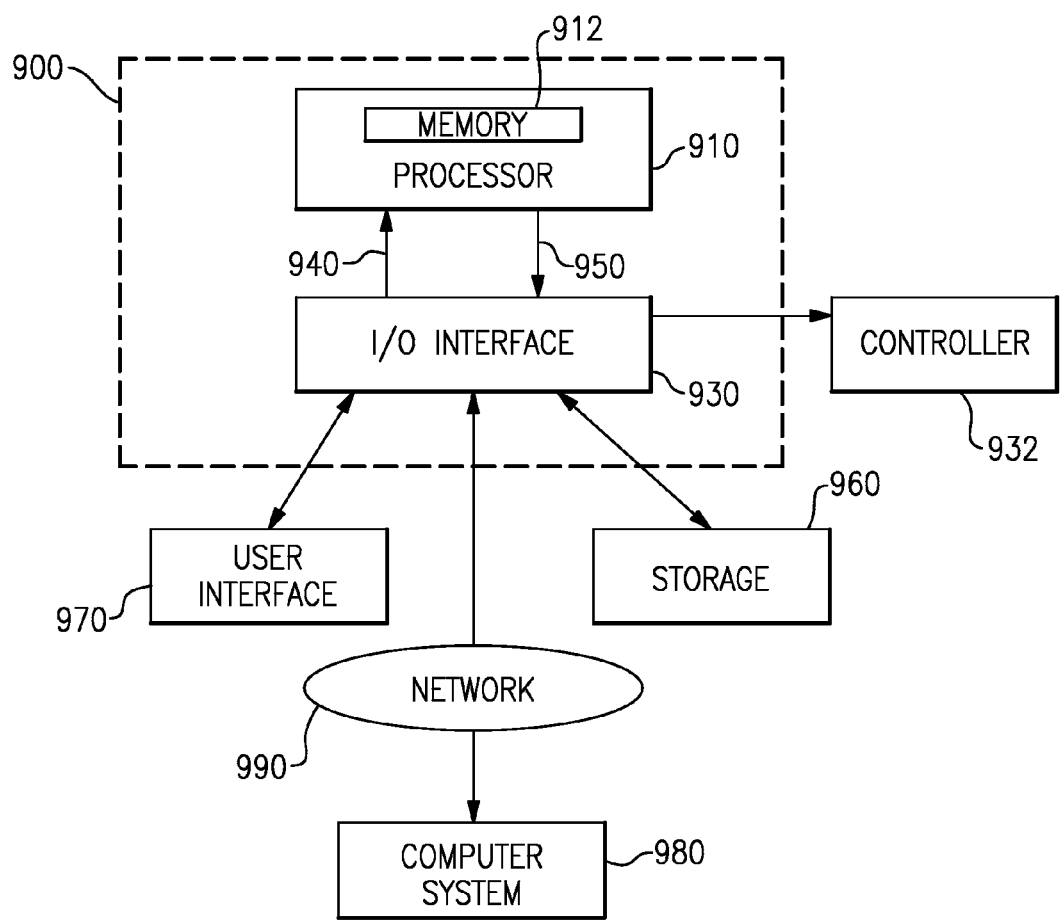
FIG. 19 is a schematic diagram illustrating an information processing system in accordance with an embodiment of the invention.

FIG. 19 illustrates an information processing system 900 in accordance with an embodiment of the invention. The information processing system can be connected with a controller 932 for receiving data from measurement tools, e.g., an AIMS measurement tool used to aerial images of a mask, or a scanning electron microscope (SEM) used to take electron micrographs of a wafer or portion thereof. As shown in FIG. 19, the information processing system can include a processor 910 having a memory. The processor 910 may be a single processor or may include a plurality of processors arranged to execute instructions of a program in a parallel or semi-parallel manner. An input output (I/O) and network interface 930 (hereinafter "I/O interface") is provided for inputting a program including instructions and data for performing a method, such as a method according to any of the various embodiments described above, to the CPU 910 and for outputting the results of executing a program. The I/O interface can also be connected with the controller 932 for receiving measurement data, as described above, for example. The I/O interface 930 can include one or more types of interfaces to removable digital storage media such as a magnetic disk, magneto-optic disk, read/write disc, read only optical disc, digital tape, removable disk drive, and removable solid-state memory such as a portable memory card, among others. In addition, the I/O interface can include a network interface such as a modem or network adapter card for permitting transfer of information to and from a network. The I/O interface 930 may also include a display or other user interface 970 for outputting information to a user, inputting information from the user or both. The user interface 970 may additionally include or be connected with one or more other devices for receiving input from or providing output to a user, for example, a keyboard, mouse, speaker, or printer, among others. To the extent that any of the above-described types of removable storage media are inserted or connected to the I/O interface, a program containing a set of instructions that is stored in such removable storage medium can be transferred as input 940 between the I/O interface 930 and the processor 910. In addition to the program, data, e.g., a return signal from an optical pickup, to be operated upon by the instructions can also be input to the information processing system 900 over the I/O interface 930, e.g. from storage 960 or from one or more computer systems, e.g., through a server computer 980 through a network 990. Once the program and the data set to be operated upon have been loaded into the processor 910, the processor can then execute the set of instructions of the program relative to the data and provide output 950 to the I/O interface 930 connected thereto.

In one embodiment, a program containing information, e.g., instructions for performing a method according to one or more of the above-described embodiments, can be stored on one or more removable storage media to be provided to the I/O interface 930 and loaded into the processor 910. Alternatively, the program containing the instructions can be transferred from storage 960, a removable storage medium or a memory of one or more other computers, e.g., computer system 980 or other storage devices of a network to a modem, network adapter or other device of the I/O interface 930 or connected to the I/O interface 930, and then further transferred therefrom to the processor 910. After the processor 910 receives and loads the program into memory, the program is then executed relative to the set of data provided to the processor 910. Input from one or more pieces of external equipment connected with a controller 932, e.g., return signals provided by optical pickup devices (not shown), can be input to system 900 and processed.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A computer-implemented method of generating an electromagnetic field (EMF) correction boundary layer (BL) model corresponding to a mask, comprising using a computer to perform a method, the method including:
 (a) determining asymmetry factor data from aerial image measurements of a plurality of different gratings representative of features provided on a mask, the aerial image measurements having been made at a plurality of different focus settings; and
 (b) determining boundary layer (BL) model parameters of an EMF correction BL model corresponding to the mask by fitting to the asymmetry factor measurements,
 wherein step (a) includes determining first asymmetry factor data corresponding to first mask features from aerial measurements of a first grating of the plurality of different gratings, and determining second asymmetry factor data corresponding to second mask features from aerial measurements of a second grating of the plurality of different gratings and different from the first grating, and step (b) includes determining feature-dependent BL model parameters including first BL model parameters and second BL model parameters, the first BL model parameters differing from the second BL model parameters according to a difference between the first and second gratings.

2. The method as claimed in claim 1, wherein the first and second mask features include line features and the line features of the first and second mask features have differing widths, respectively, such that the first BL model parameters differ from the second BL model parameters according to the difference between the widths of the first and second mask features.

3. The method as claimed in claim 1, wherein step (b) includes applying the BL model parameters to correct a thin mask approximation (TMA) representation of the mask.

4. The method as claimed in claim 3, wherein step (b) includes using the calibrated BL model parameters to correct a TMA representation of the mask for EMF effects with respect to unpolarized light.

5. The method as claimed in claim 1, wherein step (a) includes determining the asymmetry factor data from aerial image measurements made using unpolarized light, and step (b) includes determining BL model parameters which are isotropic by fitting to the asymmetry factor data obtained from the aerial image measurements made using unpolarized light.

6. The method of claim 1, wherein in performing step (a), the asymmetry factor data are determined from aerial image measurements including X polarization measurements obtained by using light of an X polarization normal to a direction in which lines of the gratings extend, and Y polarization measurements obtained by using light of a Y polarization parallel to the direction in which the lines of the gratings extend; and wherein step (b) includes determining normal boundary layer model parameters of the EMF correction BL model corresponding to the mask by fitting to the asymmetry factor data corresponding to the X polarization measurements, and determining parallel boundary layer model parameters of the EMF correction BL model corresponding to the mask by fitting to the asymmetry factor data corresponding to the Y polarization measurements.

7. The method as claimed in claim 6, further comprising (c) generating isotropic BL model parameters by coherent combination of the normal and parallel BL model parameters.

8. A method as claimed in claim 6, further comprising (c) applying the EMF correction BL model to a lithographic model of the mask to generate a corrected mask design which is pre-compensated to account for the EMF effects of the mask with respect to unpolarized light.

9. A method of generating a mask corrected for EMF effects, comprising using a computer to perform a method, the method including:

generating an electromagnetic field (EMF) correction boundary layer (BL) model corresponding to a mask by a process comprising:

(a) determining asymmetry factor data from aerial image measurements of a plurality of different gratings representative of features provided on a mask, the aerial image measurements having been made at a plurality of different focus settings;

(b) determining boundary layer (BL) model parameters of an EMF correction BL model corresponding to the mask by fitting to the asymmetry factor measurements; and (c) applying the EMF correction BL model to a lithographic model of the mask to generate a corrected mask design which is pre-compensated to account for the EMF effects of the mask, wherein step (a) includes determining first asymmetry factor data corresponding to first mask features from aerial measurements of a first grating of the plurality of different gratings, and determining second asymmetry factor data corresponding to second mask features from aerial measurements of a second grating of the plurality of different gratings and different from the first grating, and step (b) includes determining feature-dependent BL model parameters including first BL model parameters and second BL model parameters, the first BL model parameters differing from the second BL model parameters according to a difference between the first and second gratings.

10. An information processing system comprising:

a processor; and instructions executable by the processor to perform a method, the method including:

(a) determining asymmetry factor data from aerial image measurements of a plurality of different gratings representative of features provided on a mask, the aerial image measurements having been made at a plurality of different focus settings; and (b) determining boundary layer (BL) model parameters of an EMF correction BL model corresponding to the mask by fitting to the asymmetry factor measurements, wherein step (a) includes determining first asymmetry factor data corresponding to first mask features from aerial measurements of a first grating of the plurality of different gratings, and determining second asymmetry factor data corresponding to second mask features from aerial measurements of a second grating of the plurality of different gratings and different from the first grating, and step (b) includes determining feature-dependent BL model parameters including first BL model parameters and second BL model parameters, the first BL model parameters differing from the second BL model parameters according to a difference between the first and second gratings.

11. The information processing system as claimed in claim 10, wherein in step (a) of the method, the asymmetry factor data are determined from aerial image measurements including X polarization measurements obtained by using light of an X polarization normal to a direction in which lines of the gratings extend, and Y polarization measurements obtained by using light of a Y polarization parallel to the direction in which the lines of the gratings extend;

wherein step (b) of the method includes determining normal boundary layer model parameters of the EMF correction BL model corresponding to the mask by fitting to the asymmetry factor data corresponding to the X polarization measurements, and determining parallel boundary layer model parameters of the EMF correction BL model corresponding to the mask by fitting to the asymmetry factor data corresponding to the Y polarization measurements.

12. A computer-readable recording medium having instructions recorded thereon, the instructions being executable by a processor to perform a method, the method including:
 (a) determining asymmetry factor data from aerial image measurements of a plurality of different gratings representative of features provided on a mask, the aerial image measurements having been made at a plurality of different focus settings; and
 (b) determining boundary layer (BL) model parameters of an EMF correction BL model corresponding to the mask by fitting to the asymmetry factor measurements,
  wherein step (a) includes determining first asymmetry factor data corresponding to first mask features from aerial measurements of a first grating of the plurality of different gratings, and determining second asymmetry factor data corresponding to second mask features from aerial measurements of a second grating of the plurality of different gratings and different from the first grating, and step (b) includes determining feature-dependent BL model parameters including first BL model parameters and second BL model parameters, the first BL model parameters differing from the second BL model parameters according to a difference between the first and second gratings.

13. The computer-readable recording medium as claimed in claim 12, wherein in step (a) of the method, the asymmetry factor data are determined from aerial image measurements including X polarization measurements obtained by using light of an X polarization normal to a direction in which lines of the gratings extend, and Y polarization measurements obtained by using light of a Y polarization parallel to the direction in which the lines of the gratings extend, and
 wherein step (b) of the method includes determining normal boundary layer model parameters of the EMF correction BL model corresponding to the mask by fitting to the asymmetry factor data corresponding to the X polarization measurements, and determining parallel boundary layer model parameters of the EMF correction BL model corresponding to the mask by fitting to the asymmetry factor data corresponding to the Y polarization measurements.

* * * * *